(12) United States Patent
Binnard et al.

(10) Patent No.: US 6,408,767 B1
(45) Date of Patent: Jun. 25, 2002

(54) LOW STIFFNESS SUSPENSION FOR A STAGE

(75) Inventors: Mike Binnard, Belmont; Douglas C. Watson, Campbell, both of CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/516,492

(22) Filed: Mar. 1, 2000

(51) Int. Cl.⁷ .............................................. A47B 85/00
(52) U.S. Cl. ........................................ 108/20; 108/147
(58) Field of Search ................... 108/20, 147; 248/562, 248/636, 654; 269/35, 20

(56) References Cited

U.S. PATENT DOCUMENTS

| | | | |
|---|---|---|---|
| 3,376,578 A | | 4/1968 | Sawyer |
| 4,080,009 A | * | 3/1978 | Marathe et al. ............ 108/20 X |
| 4,099,800 A | | 7/1978 | Bell et al. |
| 4,445,671 A | * | 5/1984 | Reuschenbach et al. 108/147 X |
| 4,592,590 A | * | 6/1986 | Slaats et al. ............. 108/147 X |
| 4,656,951 A | * | 4/1987 | Kimura et al. ................. 108/20 |
| 5,320,047 A | * | 6/1994 | Deurloo et al. ............... 108/20 |
| 5,337,991 A | * | 8/1994 | Young .................... 248/562 X |
| 5,528,118 A | * | 6/1996 | Lee |
| 5,623,853 A | * | 4/1997 | Novak et al. |
| 5,777,403 A | | 7/1998 | Yuan |
| 5,791,978 A | | 8/1998 | Cesna et al. |
| 6,144,442 A | | 11/2000 | 'T Mannetje et al. |
| 6,226,075 B1 | | 5/2001 | Loopstra et al. |

FOREIGN PATENT DOCUMENTS

EP 0973067 1/2000

OTHER PUBLICATIONS

Pages from "Percision Mechanics" article by David Kittell, Stamford, CT, 1989.

* cited by examiner

Primary Examiner—Jose V. Chen
(74) Attorney, Agent, or Firm—Jim Rose, Esq.; Steven G. Roeder

(57) ABSTRACT

A suspension system (18) for suspending a stage (14) spaced apart from a stage base (12) is provided herein. The suspension system (18) includes a plurality of spaced apart suspension assemblies (20). Each suspension assembly (20) includes a fluid pad (22) and an adaptable section (24). A bearing fluid (48) is directed from the fluid pad (22) to create a fluid bearing (52) between the fluid pad (22) and the stage base (12). The fluid bearing (52) allows for large displacement, frictionless motion along an X axis, along a Y axis and rotation about a Z axis. The adaptable section (24) secures the fluid pad (22) to the stage (14). The adaptable section (24) allows for relative movement between the fluid pad (22) and the stage (14). More specifically, the adaptable section (24) allows for small displacement, low stiffness motion along the Z axis and rotation about the X axis and the Y axis. In summary, the suspension system (18) permits six degrees of freedom motion and provides some vibration isolation along the Z axis.

57 Claims, 11 Drawing Sheets

LOW STIFFNESS SUSPENSION FOR A STAGE

FIELD OF THE INVENTION

The present invention relates generally to lithographic devices for the fabrication of integrated circuits on semiconductor wafers. More specifically, the present invention relates to a low stiffness, suspension system and method for suspending a stage of the lithographic device.

BACKGROUND

Lithographic devices are commonly used to transfer an image from a recticle onto a semiconductor wafer. A typical lithographic device includes a support frame, an illumination source, a reticle stage, a reticle stage base, a wafer stage, a wafer stage base, a metrology system, and a lens assembly that cooperate to transfer an image of an integrated circuit from the reticle onto the wafer. The reticle is supported and moved by the reticle stage relative to the reticle stage base and the wafer is supported and moved by the wafer stage relative to the wafer stage base.

The integrated circuits transferred onto the wafer are extremely small. Accordingly, the relative alignment between the wafer and the reticle is critical to precisely transferring the image onto the wafer and to creating high density semiconductor wafers. In order to obtain precise relative alignment, the position of the reticle and the wafer are constantly monitored by the metrology system. Subsequently, with information from the metrology system, the reticle stage moves the reticle relative to the reticle stage base and the wafer stage moves the wafer relative to the wafer stage base to precisely adjust the alignment between the reticle and the wafer.

Typically, one or more reticle stage movers are used to precisely move the reticle stage relative to the reticle stage base. Similarly, one or more wafer stage movers are used to precisely move the wafer stage relative to the wafer stage base. Each stage is typically supported above its respective stage base with air bearings, mechanical guides or magnetic bearings.

Unfortunately, existing ways of supporting the stage above the stage base are not entirely satisfactory. For example, air bearings typically permit substantially frictionless planar motion along an X axis, along a Y axis and rotation around a Z axis. However, air bearings in precision machines traditionally use a relatively small air gap and have a relatively high stiffness. This arrangement does not permit significant motion along the Z axis or rotation about the X axis and the Y axis. Further, the air bearings transmit vibration and shock forces along the Z axis to the stage. The vibration and shock forces reduce the accuracy of the device and lower the quality of the integrated circuits formed on the wafer. Alternately, low-stiffness air bearings are not stable and have turbulent flow problems.

Mechanical guides are not completely satisfactory because of friction during movement and limited degrees of freedom of motion. Magnetic bearings are not completely satisfactory because they typically require a large target of magnetic material for the levitation of the magnets. In many situations, including lithographic devices, this approach is problematic because the target interferes with the other components of the lithographic device. Further, magnetic bearings consume a large amount of power and generate a significant amount of heat.

In light of the above, it is an object of the present invention to provide a suspension system and method for suspending a stage spaced apart from a stage base. Yet another object of the present invention is to provide a suspension system for a stage that allows for large displacement, frictionless motion along the X axis, along the Y axis and around the Z axis and small-displacement, low-stiffness motion along the Z axis, and rotation about the X axis and the Y axis. Another object of the present invention is to provide a low-stiffness suspension system for a stage that allows for adjustments along the Z axis with minimal restrictions. Still another object of the present invention is to provide a frictionless suspension system that permits six degrees of freedom motion.

SUMMARY

The present invention is directed to a suspension system for maintaining a stage spaced apart from a stage base which satisfies these needs. The suspension system includes one or more spaced apart, suspension assemblies. Each suspension assembly includes a fluid pad and an adaptable section. A fluid is directed from the fluid pad towards the stage base to create a fluid bearing between the fluid pad and the stage base. The fluid bearing allows for large displacement, frictionless motion of the suspension assembly and the stage along an X axis, along a Y axis and rotation about a Z axis. The adaptable section secures the fluid pad to the stage. The adaptable section allows for relative movement between the fluid pad and the stage. More specifically, the adaptable section allows for small displacement, low-stiffness motion between the fluid pad and the stage along the Z axis, and rotation about the X axis and the Y axis.

Basically, each suspension assembly utilizes the relatively soft, adaptable section in series with a relatively high stiffness, fluid bearing. With this design, the suspension assembly permits six degrees of freedom motion and provides some vibration isolation along the Z axis. Suitable adaptable sections include a flexible, fluid chamber, a coil spring, a constant force spring, a leaf spring, a flexible member, and/or an air spring. As provided herein, the stiffness of the adaptable section can be varied. For example, a controller can control the stiffness of the adaptable section by changing the characteristics of the chamber fluid in the fluid chamber.

Additionally, each suspension assembly can include a restrictor which inhibits motion of the fluid pad transverse to a suspension axis of each suspension assembly. The restrictor maintains the fluid pad substantially parallel with the stage base. As provided herein, the restrictor can encircle a portion of the suspension assembly and inhibit motion of the fluid pad transverse to the suspension axis. Alternately, the restrictor can extend between the fluid pad and stage and inhibit motion of the fluid pad transverse to the suspension axis.

One or more movers can be used to move the suspended stage relative to the stage base. Further, the movers can be used to move the stage relative to the fluid pads of each suspension assembly. Suitable movers include one or more linear motors, planar motors, voice coil actuators and/or El core motors.

The present invention is also a method for suspending a stage spaced apart from a stage base. The method includes creating a fluid bearing between a fluid pad and the stage base and securing the fluid pad to the stage with an adaptable section.

Importantly, each suspension assembly permits six degrees of freedom motion between the stage and the stage base, provides some vibration isolation along the Z axis and supports the stage without electrical power consumption of the movers.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
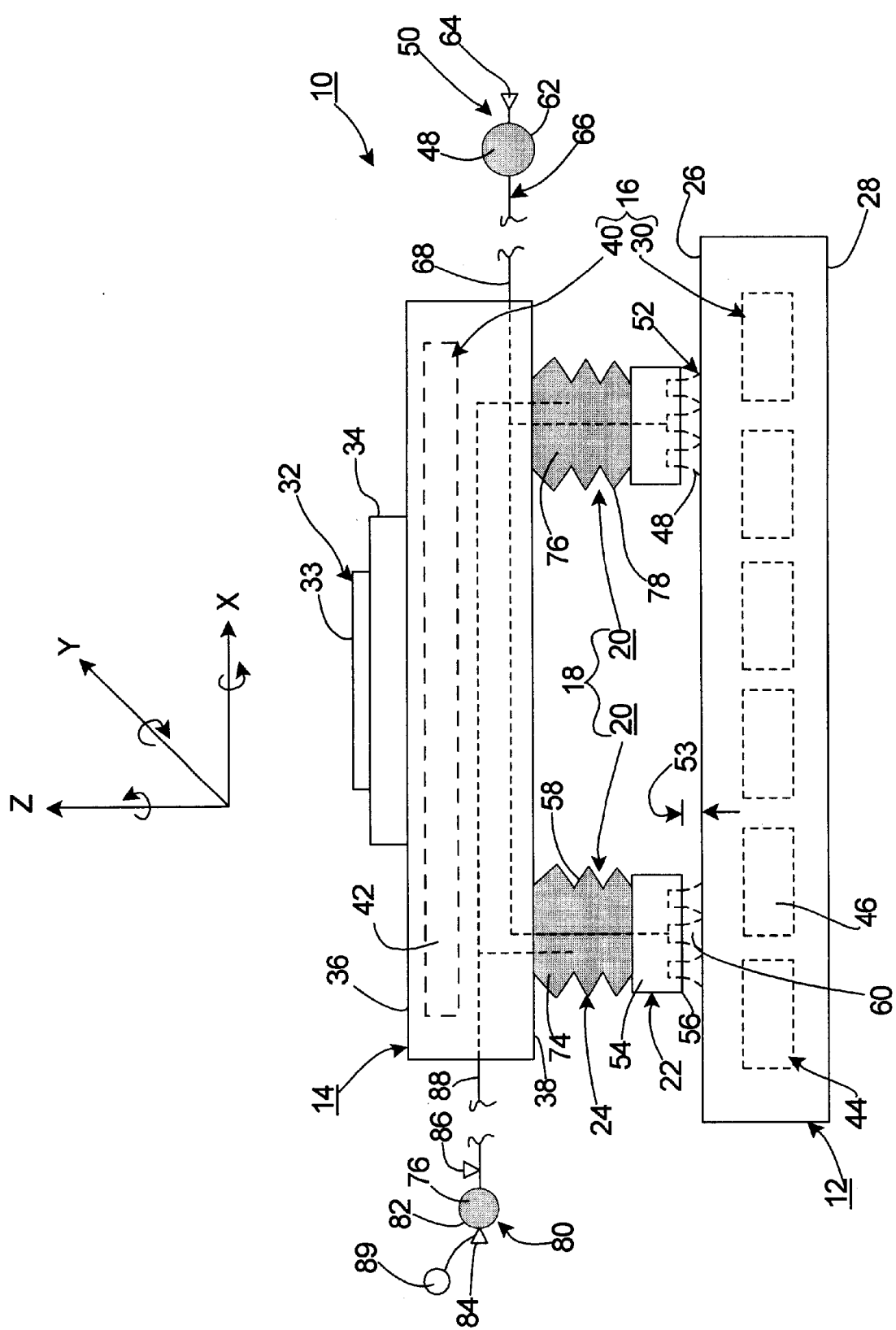
FIG. 1 is a side illustration of a stage assembly having features of the present invention.

FIG. 1 illustrates a stage assembly 10 having features of the present invention. The stage assembly 10 includes a stage base 12, a stage 14, a mover 16 (shown in phantom) and a suspension system 18 for maintaining the stage 14 spaced apart from the stage base 12. The suspension system 18 includes a plurality of spaced apart suspension assemblies 20 for suspending the stage 14 apart from the stage base 12. As provided below, each suspension assembly 20 includes a fluid pad 22 and an adaptable section 24 that secures the fluid pad 22 to the stage 14.

Uniquely, the suspension system 18 allows for large-displacement, frictionless motion of the stage 14 relative to the stage base 12 along an X axis, along a Y axis and rotation about a Z axis. Further, the suspension system 18 allows for small-displacement, low stiffness motion of the stage 14 relative to the stage base 12 along the Z axis and rotation about the X axis and the Y axis. The coordinate system used for this discussion is also illustrated in FIG. 1. With this design, each suspension assembly 20 permits six degrees of freedom motion of the stage 14 relative to the stage base 12, and provides some vibration isolation of the stage 14 from the stage base 12 along the Z axis.

Figure 2:
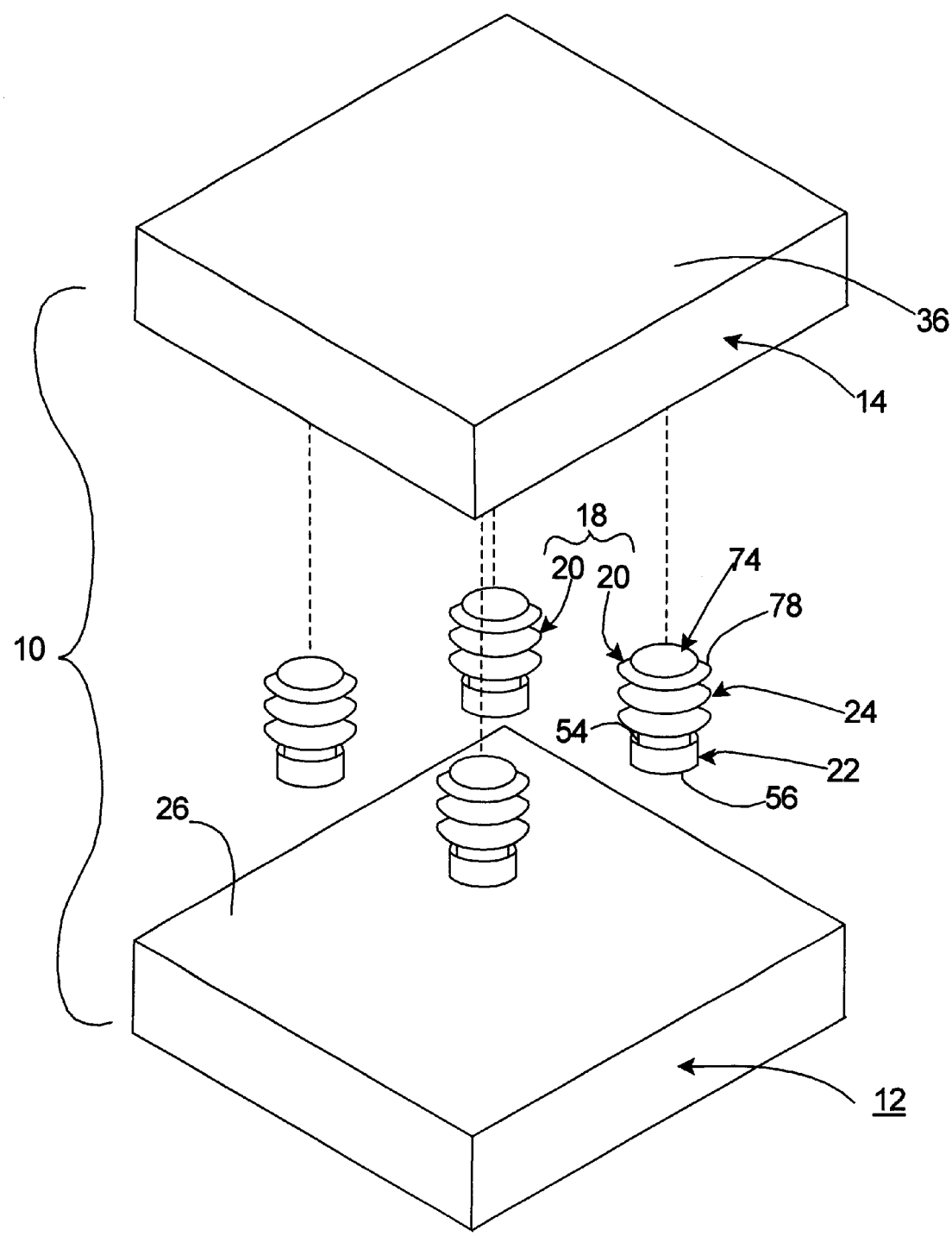
FIG. 2 is an exploded perspective view of a portion of the stage assembly of FIG. 1.

The stage base 12 supports the stage 14 via the suspension system 18. The design of the stage base 12 can be varied to suit the design requirements of the stage assembly 10. FIG. 1 illustrates a side plan view and FIG. 2 illustrates a perspective view of a suitable stage base 12. In particular, the stage base 12 illustrated therein is shaped similar to a flat plate and includes a planar upper surface 26 and a planar lower surface 28. The upper surface 26 provides a smooth, flat, planar, surface for interaction with the suspension system 18.

FIG. 1 illustrates that a first mover portion 30 (shown in phantom) of the mover 16 can be positioned within the stage base 12. A more complete discussion of the mover 16 is provided below. The stage base 12 can be made of low or non-electrically conductive, non-magnetic material, such as low electrical conductivity stainless steel or titanium, or non-electrically conductive plastic or ceramic.

The stage 14 is suspended and maintained spaced apart from the stage base 12. The design of the stage 14 can be varied according to the design requirements of the stage assembly 10. The stage 14 illustrated in FIG. 1 is designed to retain an object 32 that is to be positioned by the stage assembly 10. In the embodiment illustrated in FIG. 1, the object 32 is a semiconductor wafer 33 and stage assembly 10 is design to precisely move and position the semiconductor wafer 33 during processing and/or inspection. The stage 14 illustrated in FIG. 1 also includes a holder 34, i.e. a vacuum chuck for securing the object 32 to the stage 14. Alternately, the stage 14 could be designed for other usages. For example, the stage 14 could be used to move and precisely position a reticle during wafer lithography, a reticle during reticle manufacturing, an object in an electron microscope, an object during a precision measurement operation or an object during precision manufacturing.

FIG. 2 illustrates a perspective view of the stage 14 without the holder 34 and the semiconductor wafer 33. The stage 14 illustrated in the FIGS. 1 and 2 is shaped similar to a flat plate and includes a planar top surface 36 and a planar bottom surface 38. However, the shape of the stage 14 is not limited to planar surfaces. More specifically, the shape of the stage 14 can be varied to suit the design requirements of the stage assembly 10.

FIG. 1 illustrates that a second mover portion 40 (shown in phantom) of the mover 16 can be positioned within the stage 14. A more complete discussion of the mover 16 is provided below. The stage 14 can be made of low or non-electrically conductive, non-magnetic material, such as low electrical conductivity stainless steel or titanium, or non-electrically conductive plastic or ceramic.

The mover 16 moves the stage 14 relative to the stage base 12. The design of the mover 16 can be varied to suit the movement requirements of the stage 14. In the embodiment illustrated in FIG. 1, the mover 16 is a planar motor and includes the first mover portion 30 positioned in the stage base 12 and the second mover portion 40 positioned in the stage 14. For a planar motor, one of the mover portions 30, 40 is a magnet array 42 while the other mover portion 30, 40 is a conductor array 44. Typically, the magnet array 42 is positioned in the stage 14 while the conductor array 44 is positioned in the stage base 12. Alternately, the magnet array 42 can be positioned in the stage base 12 and the conductor array 44 can be positioned in the stage 14.

The conductor array 44 includes a plurality of conductors 46. Electrical current (not shown) is supplied to the conductors 46. The electrical current in the conductor 46 interacts with a magnetic field of the magnet array 42. This causes a force between the magnet array 42 and conductor array 44 which can be used to control, move, and position the stage 14 relative to the stage base 12. The current level for each conductor 46 within the magnetic field may be determined according to the desired resultant forces.

The mover 16 preferably moves and adjusts the position of the stage 14 relative to the stage base 12 in six degrees of freedom. The planar motor illustrated in FIG. 1 can adjust the position of the stage 14 relative to the stage base 12 in all six degrees of freedom, i.e. along the X axis, Y axis, and the Z axis and rotation about the X axis, the Y axis and the Z axis. Importantly, for each suspension assembly 20, the adaptable section 24 allows the mover 16 to adjust the position of the stage 14 relative to the fluid pad 22 in the out-of-plane directions, i.e., along the Z axis and rotation about the X axis and the Y axis. It should be noted that the present invention saves energy because the mover 16 is not used to maintain the stage 14 spaced apart from the stage base 12.

Alternately, for example, the mover 16 can include one or more linear motors, shaft motors, and/or actuators that adjust the position of the stage 14 relative to the stage base 12 in one or more degrees of freedom.

The suspension system 18 provided herein preferably suspends and supports the stage 14 spaced apart from the stage base 12 without any additional supports (not shown) such as guides, or magnetic bearings supporting the stage 14 apart from the stage base 12. Stated another way, the suspension assembly 18 suspends the stage 14 above the stage base 12 without direct attachment between the stage 14 and the stage base 12. As provided above, the suspension system 18 preferably includes a plurality of spaced apart suspension assemblies 20 that support and suspend the stage 14 spaced apart and above the stage base 12. The number and spacing of the suspension assemblies 20 can be varied. For example, four, spaced apart suspension assemblies 20 can be utilized as illustrated in FIG. 2. Alternately, more than four or less than four suspension assemblies 20 can be used.

The design of each suspension assembly 20 can be varied to suit the design requirements of the stage assembly 10. A number of alternate designs of the suspension assemblies 20 is provided herein. In each embodiment, the suspension assemblies 20 allow for large-displacement, fricitionless motion of the stage 14 relative to the stage base 12 in the in-plane directions, i.e., along the X axis, along the Y axis and rotation about the Z axis. Further, the suspension assemblies 20 allow for small displacement, low stiffness motion of the stage 14 in the out-of plane directions, i.e. along the Z axis and rotation about the X axis and Y axis.

Referring back to FIG. 1, a bearing fluid 48 from a bearing fluid source 50 (illustrated in FIG. 1) is directed from each fluid pad 22 to create a fluid bearing 52 which suspends each fluid pad 22 a fluid gap 53 above the stage base 12. The fluid bearing 52 typically has a relatively high stiffness.

In the embodiments illustrated herein, each fluid pad 22 includes a pad top 54 and a pad bottom 56. Each fluid pad 22 also includes one or more fluid inlets 58 and one or more spaced apart fluid outlets 60 that extend though the pad bottom 56. Bearing fluid 48 from the bearing fluid source 50 is directed through the fluid inlet 58 and out the fluid outlets 60 of each fluid pad 22 to suspend and support each fluid pad 22 away from the stage base 12.

The bearing fluid source 50 forces or directs the bearing fluid 48 through the fluid pads 22 to maintain the fluid pads 22 spaced apart from the stage base 12. The design of the bearing fluid source 50 can be varied to suit the requirements of the stage assembly 10. Referring to FIG. 1, the bearing fluid 50 source illustrated includes (i) a container 62 for receiving the bearing fluid 48, (ii) a compressor 64 for pressurizing the bearing fluid 48 in the container 62, (iii) a regulator 66 for regulating flow of the bearing fluid 48 out of the container 62, and (iv) an outlet pipe 68 which connects the container 62 in fluid communication with the fluid inlet 58 of each fluid pad 22.

The flow rate, pressure and type of the bearing fluid 48 is selected and controlled to precisely control the amount of the fluid gap 53 between the fluid pad 22 and the stage base 12 and the stiffness of the fluid bearing 52. For the embodiments illustrated, the fluid gap 53 is typically maintained between approximately one microns and ten microns. The bearing fluid 48, for example, can be air or some other gas. When air is utilized, an "air bearing" is created between the fluid pad 22 and the stage base 12.

Figure 3:
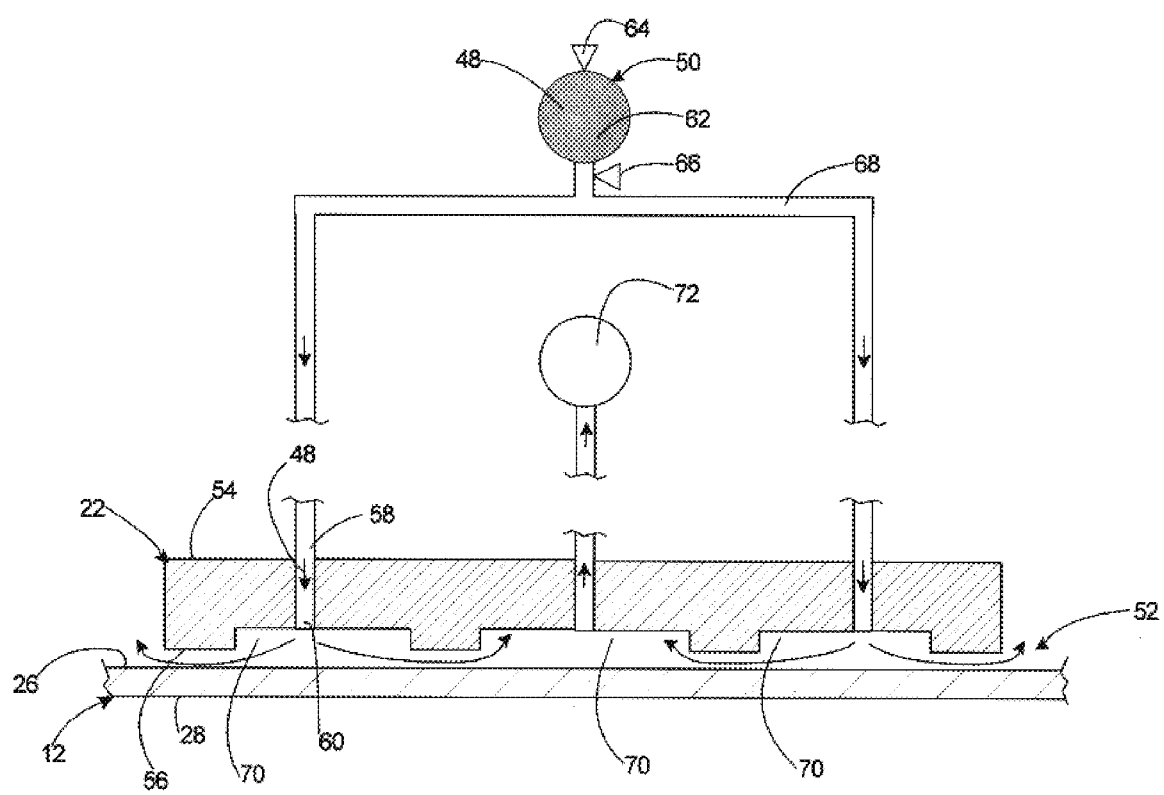
FIG. 3 is a cut-away view of a fluid pad, a stage base, a bearing fluid source and a vacuum source having features of the present invention.

The shape of each fluid pad 22 can be varied to suit the design requirements of the stage assembly 10. Each fluid pad 22 illustrated in the Figures is substantially disk shaped. Alternately, for example, each fluid pad 22 could be rectangular shaped. Preferably, a vacuum is created between each fluid pad 22 and the stage base 12 to increase the stiffness and stability of the fluid bearing 52. FIG. 3 illustrates a cross-sectional view of a fluid pad 22 and the stage base 12 having features of the present invention. In FIG. 3, the pad bottom 56 is mainly flat and includes three spaced apart cut-outs 70. The cut-outs 70 are typically relatively shallow, i.e. approximately one to three microns deep. The shape of the cut-outs 70 can be varied. For example, each cut-out 70 can have a rectangular or circular cross-section. In this embodiment, bearing fluid 48 from the bearing fluid source 50 is directed out two fluid outlets 60 into two of the cut-outs 70. This creates a plenum near each fluid outlet 60. Concurrently, a vacuum source 72 is used to create a vacuum in the third cut-out 70. For this embodiment, when air is utilized for the bearing fluid 48, a vacuum preloaded air bearing is created between the fluid pad 22 and the stage base 12.

The adaptable section 24 secures the fluid pad 22 to the stage and allows for relative movement between the fluid pad 22 and the stage 14. Importantly, the adaptable section 24 allows for small displacement, low stiffness motion in the out-of plane directions, i.e. along the Z axis, about the X axis and about the Y axis. Further, the low stiffness of the adaptable section 24 allows the mover 16 to precisely move the stage 14 in the out-of-plane directions, i.e., along the Z axis and rotate about the X axis and Y axis, with minimal restriction and without influencing the position of the fluid pad 22 relative to the stage base 12. Thus, the mover 16 can adjust the position of the stage 14 while maintaining the fluid pad 22 substantially parallel with the stage base 12.

The design of the adaptable section 24 can be varied according to the design of the rest of the stage assembly 10 and is varied according to the weight of stage 14. A number of alternate embodiments of the adaptable section 24 are provided herein. In particular, FIGS. 1, 2, and 4–7 illustrate that each adaptable section 24 can be a flexible fluid chamber 74 which is at least partly filled with a chamber fluid 76. More specifically, in these embodiments, each adaptable section 24 includes a flexible, tubular shaped, pleated body 78 which defines the fluid chamber 74. The chamber fluid 76 from a chamber fluid source 80 is forced into the fluid chamber 80 of each adaptable section 24.

Referring to FIG. 1, the chamber fluid source 80 can include (i) a container 82 for receiving the chamber fluid 76, (ii) a compressor 84 for compressing the chamber fluid 76 in the container 82, (iii) a regulator 86 for controlling flow of the chamber fluid 76, and (iv) an outlet pipe 88 which connects the container 82 in fluid communication with each fluid chamber 74. The flow rate, pressure and type of the chamber fluid 76 is selected and controlled by controller 89 to precisely control the stiffness of the adaptable section 24 and the distance between the fluid pad 22 and the stage 14. The chamber fluid 76, for example, can be air or some other gas. When air is utilized, an "air bellow" is created between the fluid pad 22 and the stage 14. Importantly, the fluid 76 must be compressible or the chamber 74 must be elastic to allow for relative movement between the fluid pad 22 and the stage 14.

Figure 4:
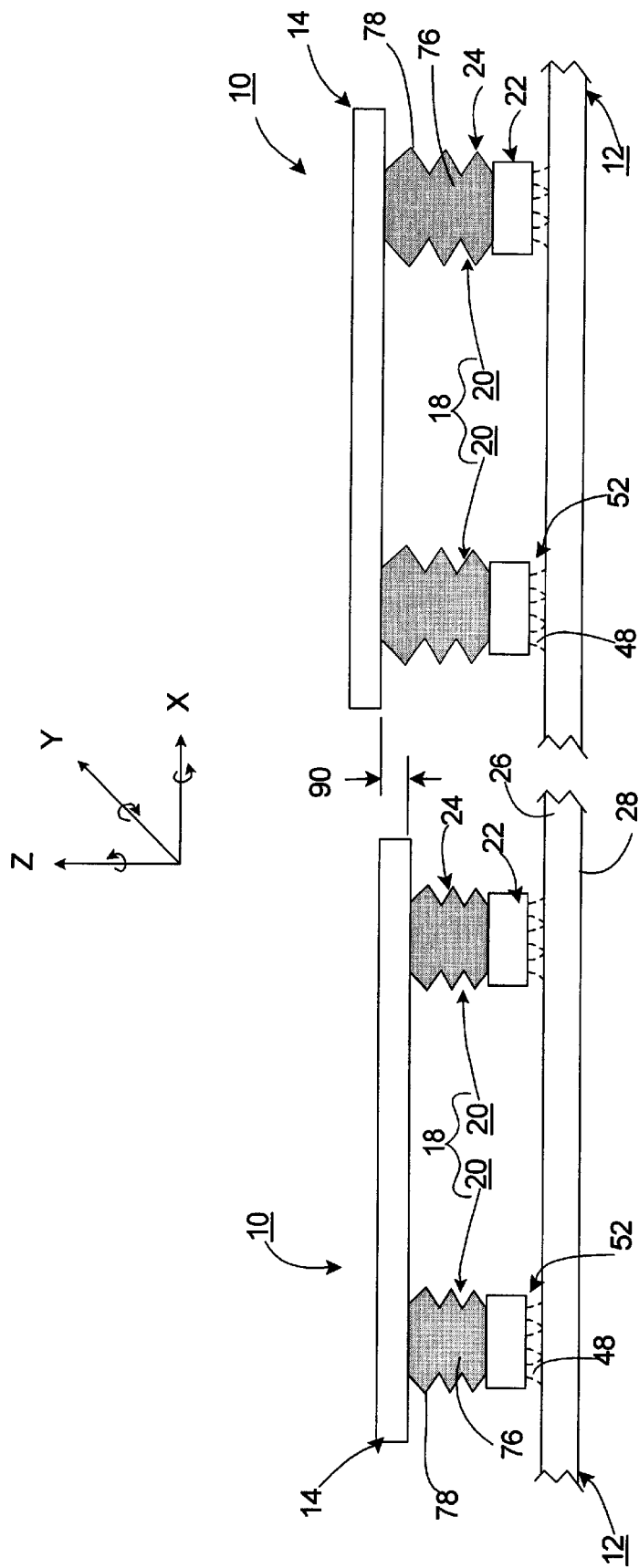
FIG. 4 is side illustration of a stage assembly at two alternate positions.

FIG. 4 is a side illustration of a stage assembly 10 with the stage 14 at alternate positions. In particular, FIG. 4 illustrates that the nominal static position of the stage 14 relative to the stage base 12 along the Z axis can be adjusted by changing the pressure of the chamber fluid 76 inside each fluid chamber 74. More specifically, an increase in pressure inside each fluid chamber 74 raises the stage 14 a distance 90 that corresponds to the increase in pressure divided by the stiffness of the adaptable section 24. Importantly, the adjustment along the Z axis can be done without significantly altering the stiffness of each adaptable section 24.

Figure 5:
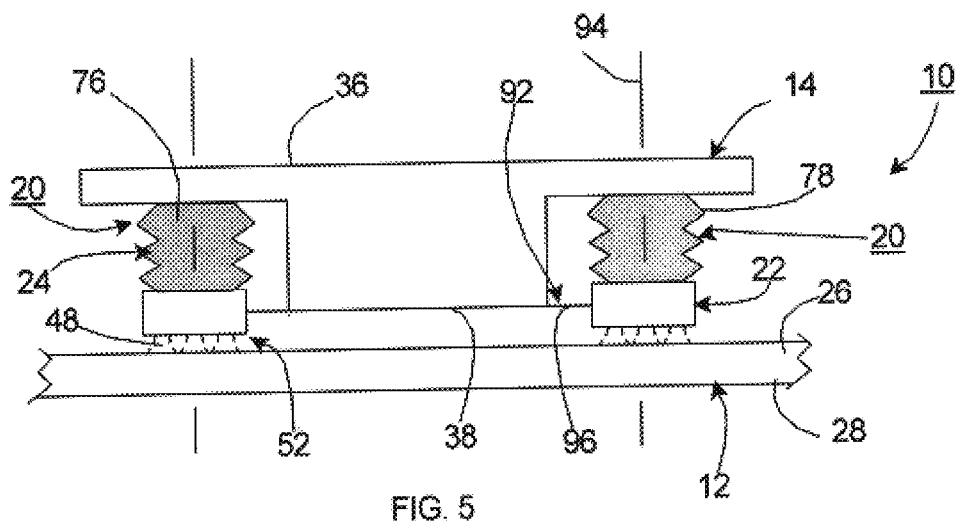
FIG. 5 is a side illustration of another embodiment of a stage assembly having features of the present invention.

Referring to FIG. 5, each suspension assembly 20 can include a restrictor 92 that inhibits motion of the fluid pad 22 transverse to a suspension axis 94 of each suspension assembly 20 and inhibits low-frequency resonance transverse to the suspension axis 94 and the stage 14. The restrictor 92 compensates for the low lateral stiffness along the X axis and Y axis of each adaptable section 24. As illustrated in FIG. 5, the restrictor 92 can be a pair of flexible rods 96 (only one is illustrated for each fluid pad 22) that secures one fluid pads 22 to the stage 14.

Figure 6:
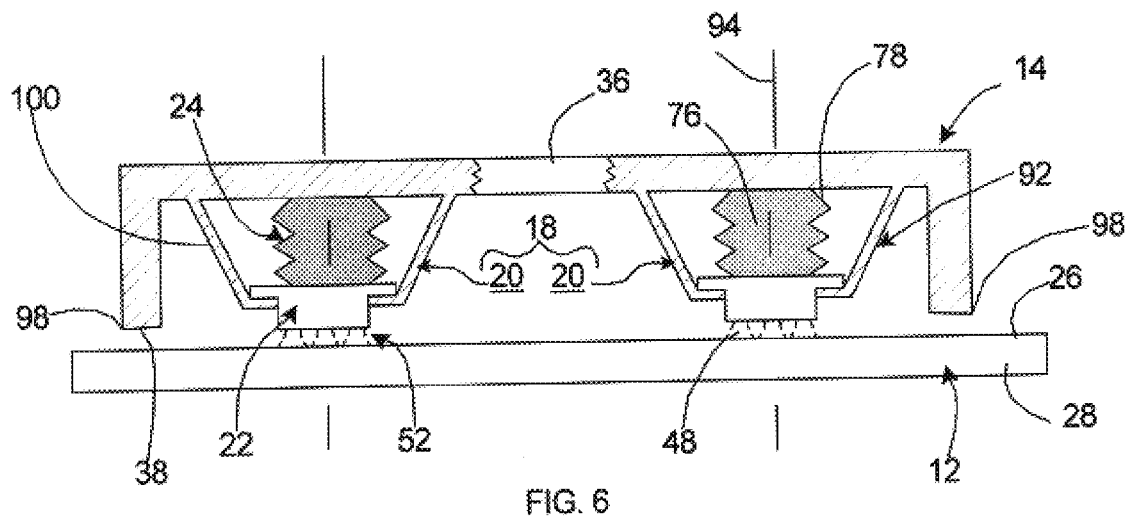
FIG. 6 is a side illustration, in partial cut-away, of yet another embodiment of a stage assembly having features of the present invention.
Figure 7:
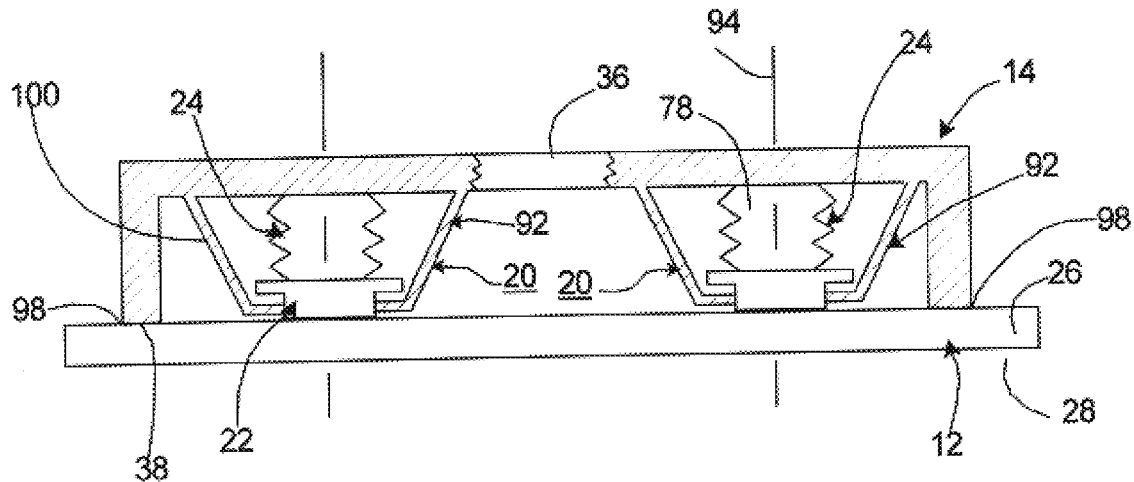
FIG. 7 is a side illustration, in partial cut-away, of the embodiment of FIG. 6 alternately positioned.

FIGS. 6 and 7 illustrate that the suspension system 18 can have alternate uses. More specifically, as illustrated in FIG. 6, the suspension system 18 can be used to temporarily support the stage 14 above the stage base 12. This allows the stage 14 to be moved relative to the stage base 12 from one location to another location. After the stage 14 is moved, the flow of the bearing fluid 48 to the fluid pads 22 and the flow of the chamber fluid 76 to the fluid chamber 74 is discontinued. As illustrated in FIG. 7, this allows the stage 14 to be supported by reference pads 98 against the stage base 14 instead of the fluid pads 22. In this embodiment, the fluid chambers 74 provide extra lift for the stage 14 in addition to the relatively small flying height of the fluid bearing 52. Restrictors 92 can be used if the natural frequency of the stage 12 while supported by the suspension assemblies 20 is too low. More specifically, each restrictor 92 increases the stiffness of one of suspension assemblies 20. In this embodiment, each restrictor 92 is a conical, tubular shaped body 100 which encircles the fluid pad 22 and the adaptable section 24. Each body 100 restricts motion of one fluid pad 22 relative to the stage 14.

Figure 8A:
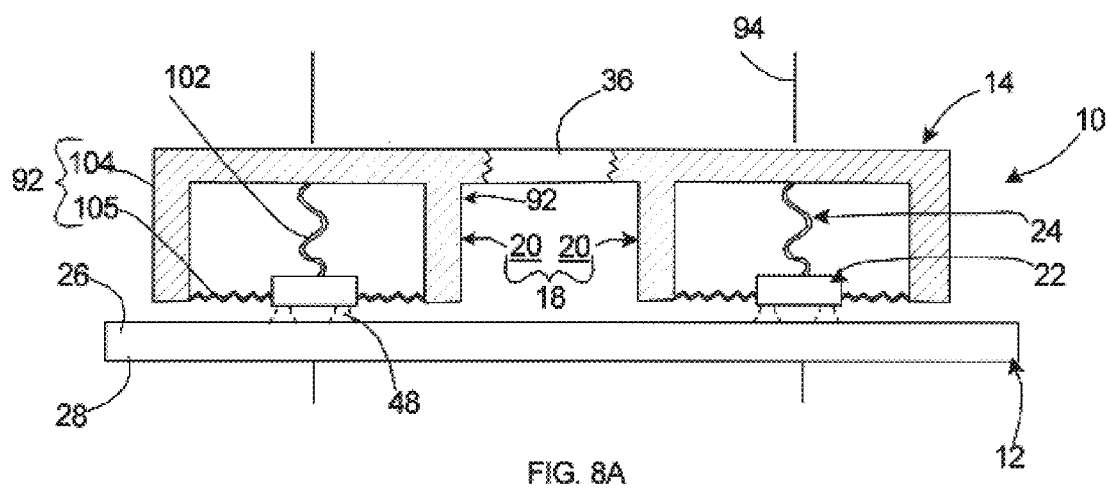
FIG. 8A is a side illustration, in partial cut-away, of yet another embodiment of a stage assembly having features of the present invention.
Figure 8B:
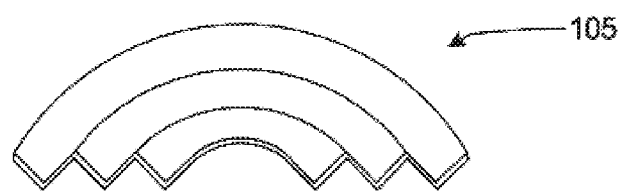
FIG. 8B is partly cutaway perspective view of a centering structure having features of the present invention.

FIG. 8A illustrates an alternate embodiment of the adaptable section 24. In particular, in this embodiment, each adaptable section 24 is a coil spring 102. Each coil spring 102 allows for small displacement, low stiffness motion in the out-of-plane directions. The design of each coil spring 102 will vary according to the design of the stage assembly 10 and the weight of the stage 14. For example, each coil spring 102 can have a spring constant of between approximately 100 and 10,000 N/m. The embodiment in FIG. 8A, also includes a restrictor 92 to increase the lateral stiffness for each suspension assembly 20. In this embodiment, each restrictor 92 includes a tubular shaped skirt 104 and a flexible centering structure 105. The skirt 104 is rigid and encircles a portion of one suspension assemblies 20. The centering structure 105 extends between the skirt 104 and the fluid pad 22 and inhibits lateral motion of the fluid pad 22 relative to the suspension axis 94 and the stage 14. A partly cutaway view of a suitable centering structure 105 is illustrated in FIG. 8B.

Figure 9:
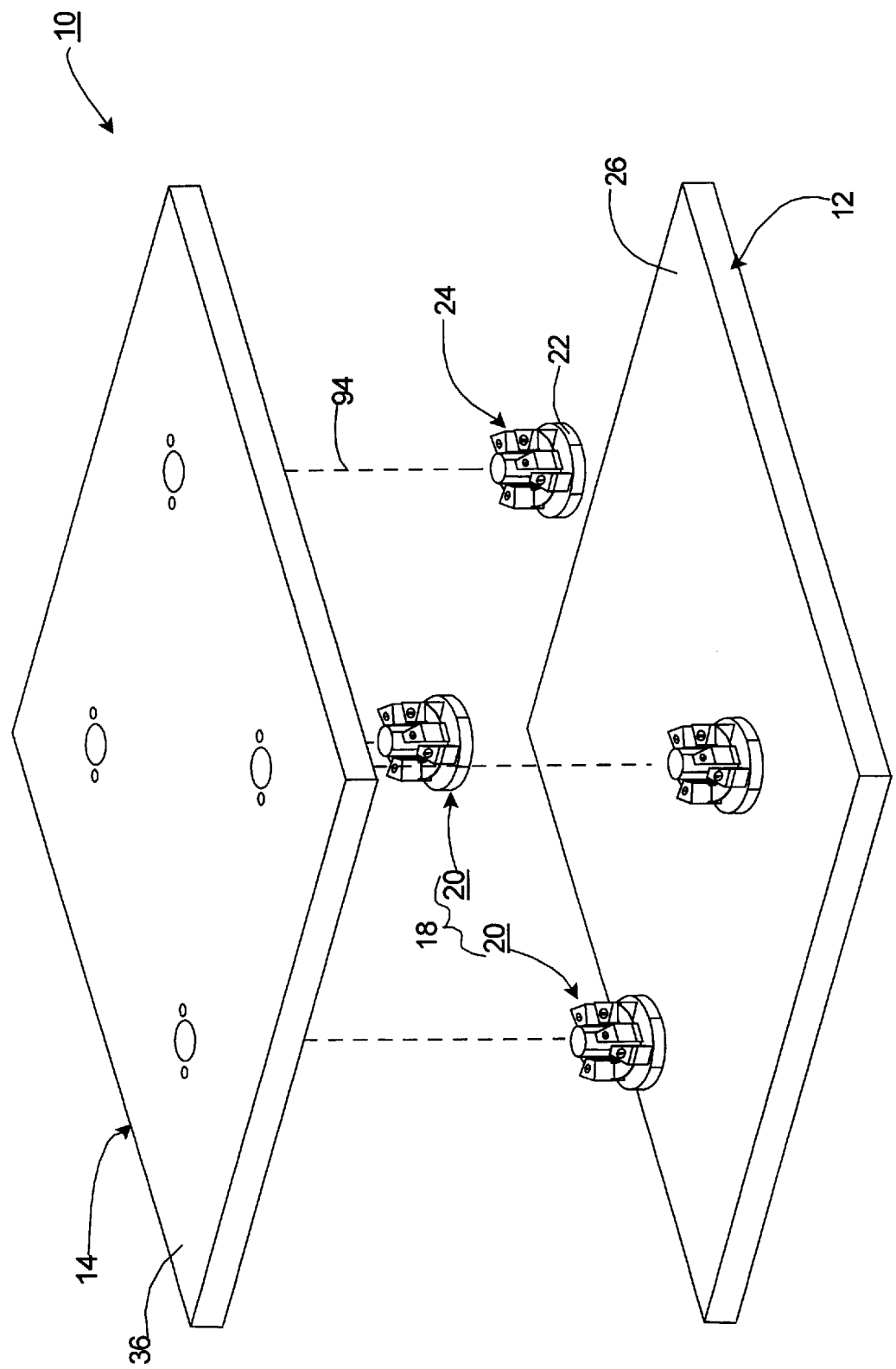
FIG. 9 is an exploded, perspective view of another embodiment of a stage assembly having features of the present invention.
Figure 10:
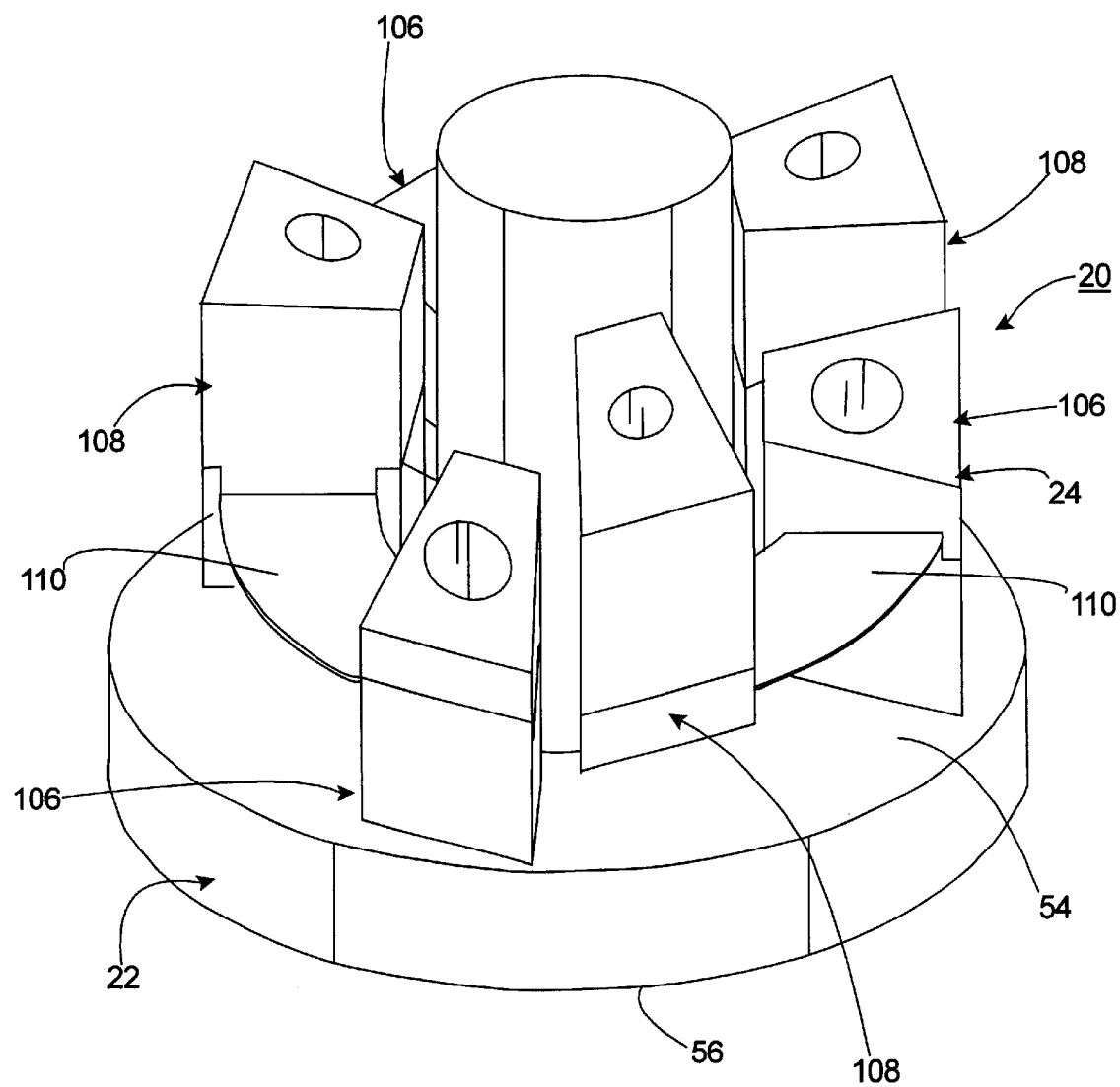
FIG. 10 is a perspective view of a suspension assembly having features of the present invention.

FIGS. 9 and 10 illustrate another alternate embodiment of a suspension assembly 20. More specifically, FIG. 9 illustrates an exploded perspective view of a stage assembly 10 having a planar stage base 12, a planar stage 14 and a plurality of spaced apart suspension assemblies 20. FIG. 10 illustrates an enlarged perspective view of one of the suspension assemblies 20 from FIG. 9. In this embodiment, each suspension assembly 20 includes the fluid pad 22 and the adaptable section 24. The fluid pad 22 is again used in conjunction with a bearing fluid source 50 (not shown in FIGS. 9 and 10) to create a fluid bearing 52 (not shown in FIGS. 9 and 10) between the fluid pad 22 and the stage base 12. The fluid pad 22 is somewhat similar to that described above.

In the embodiment illustrated in FIGS. 9 and 10, each adaptable section 24 includes (i) three, spaced apart lower blocks 106 which are secured to the pad top 54 of the fluid pad 22, (ii) three, spaced apart, upper blocks 108 which are secured to the stage 12 with bolts (not shown) which extend through the stage 12, and (iii) three flexible members 110 (only two are shown). In this embodiment, each flexible member 110 is a flat, spring like structure which extends between one of the upper blocks 108 and one of the lower blocks 106. Each flexible member 110 allows for movement of one of the upper blocks 108 relative to one of the lower blocks 106. This, in turn, allows the mover 16 (not shown in FIGS. 9 and 10) to adjust the position of the stage 14 relative to the stage base 12 in the out-of-plane directions. The geometry and shape of the flexible member 110 determines the overall stiffness of each suspension assembly 20. Importantly, this design permits six degrees of freedom motion of the stage 14 while maintaining the pad bottom 56 of the fluid pad 22 to remain parallel to the upper surface 26 of the stage base 12 as the adaptable section 24 moves along the Z axis and tilts around the X axis and Y axis.

Still alternately, the adaptable section 24 can include a constant force spring, a flexure, a flexible diaphragm, a leaf spring, and air springs or an active component such as a voice coil motor.

Typically, the stiffness of the fluid bearing 52 is high and the mass of the fluid pad 22 is low. The low mass coupled with the high stiffness of the fluid bearing 52 yields a high natural frequency for the fluid pad 22. The natural frequency of the stage 14 is determined by the stiffness of the adaptable section 24 and the mass of the stage 14 that is high. In a prototype designed in accordance with the present invention, the natural frequency of the fluid pad 22 is approximately 700 Hz and the natural frequency of the stage 14 is about 8 Hz. Because the bandwidth of a six degrees of freedom control system for the stage is around 100 Hz, the motion of the stage 14 along the Z axis was easily controllable and the stage 14 was not influenced by vibration of the fluid pad 22.

Further, with the fluid bearing 52, the damping increases with frequency due to squeeze-film effect. Accordingly, the stability of each suspension assembly 20 is relatively high when compared to an air bearing (not shown) directly attached to the full mass of the stage. Additionally, the stiffness, resonant frequency and damping will be increased with gravity preloading and vacuum preloading of the fluid bearing 52.

Figure 11:
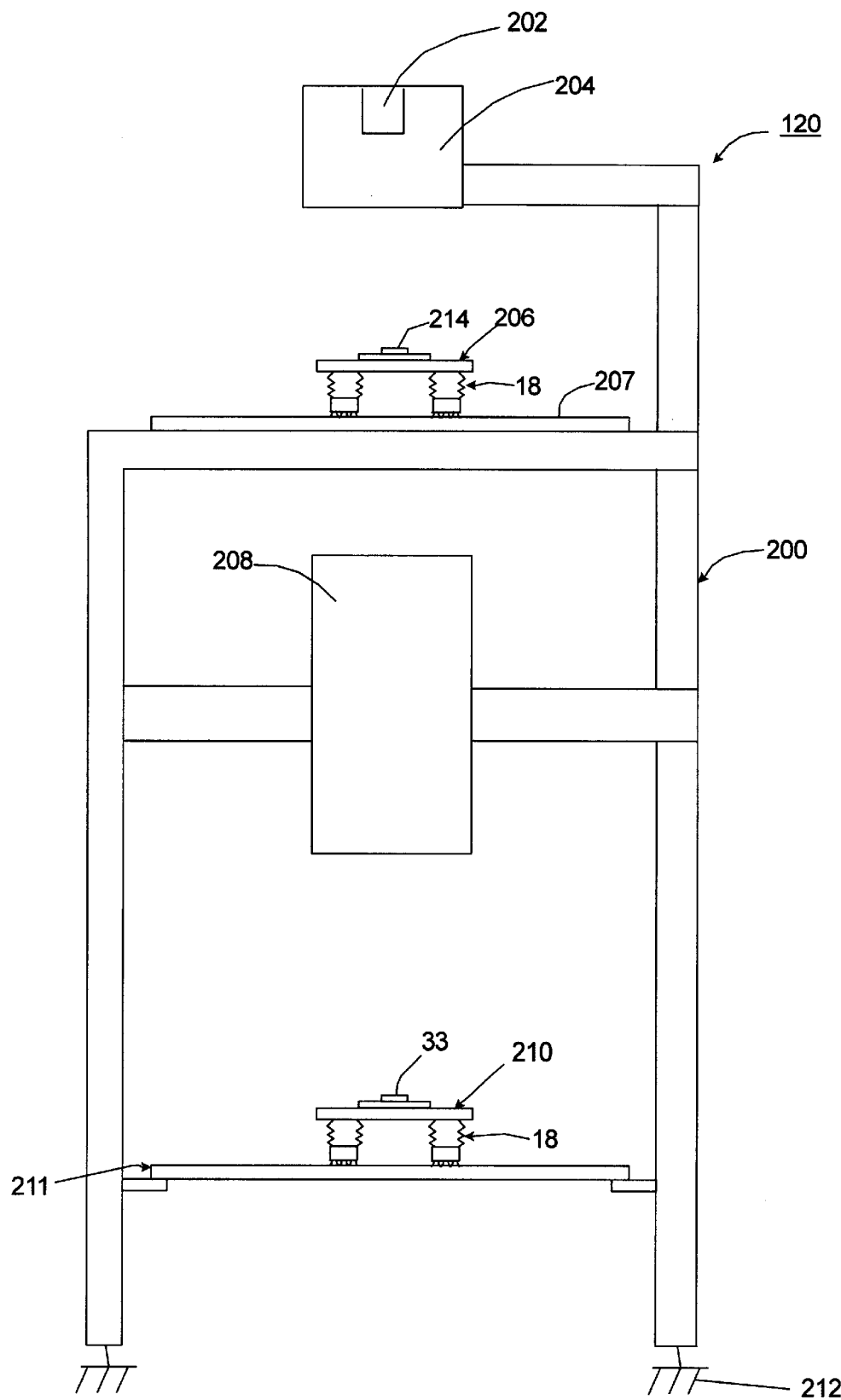
FIG. 11 is schematic illustration of an exposure apparatus having features of the present invention.

FIG. 11 is a schematic view illustrating an exposure apparatus 120 useful with the present invention. The exposure apparatus 120 includes an apparatus frame 200, a light source 202, an illumination system 204 (irradiation apparatus), a reticle stage 206, a reticle stage base 207, a lens assembly 208, a wafer stage 210, and a wafer stage base 211. The stage assemblies 10 provided herein can be used as the reticle stage 206 and/or the wafer stage 210.

The exposure apparatus 120 is particularly useful as a lithographic device that transfers a pattern (not shown) of an integrated circuit from a reticle 214 onto the semiconductor wafer 33. The exposure apparatus 120 mounts to a mounting base 212, e.g., the ground, a base, or floor or some other supporting structure.

The apparatus frame 200 is rigid and supports the components of the exposure apparatus 120. The design of the apparatus frame 200 can be varied to suit the design requirements for the rest of the exposure apparatus 120. The apparatus frame 200 illustrated in FIG. 11 supports the lens assembly 208, the light source 202, the illumination system 204 and the stage bases 209, 211 above the mounting base 212.

The light source 202 emits the beam (irradiation) of light energy. The illumination system 204 guides the beam of light energy from the light source 202 to the lens assembly 208. The beam illuminates selectively different portions of the reticle and exposes the wafer. In FIG. 11, the light source 202 is illustrated as being supported above the reticle stage 206. Typically, however, the light source 202 is secured to one of the sides of the apparatus frame 200 and the energy beam from the light source 202 is directed to above the reticle stage 206 with the illumination system 204.

The lens assembly 208 projects and/or focuses the light passing through the reticle to the wafer. Depending upon the design of the exposure apparatus 120, the lens assembly 208 can magnify or reduce the image illuminated on the reticle.

The reticle stage 206 holds and positions the reticle relative to the lens assembly 208 and the wafer. Similarly, the wafer stage 210 holds and positions the wafer with respect to the projected image of the illuminated portions of the reticle. In FIG. 11, the wafer stage 210 and the reticle stage 206 each utilize a stage assembly 10 having features of the present invention. Depending upon the design, the exposure apparatus 120 can also include additional motors to move the stages 210, 206.

There are a number of different types of lithographic devices. For example, the exposure apparatus 120 can be used as scanning type photolithography system that exposes the pattern from the reticle onto the wafer with the reticle and wafer moving synchronously. In a scanning type lithographic device, the reticle is moved perpendicular to an optical axis of the lens assembly 208 by the reticle stage 206 and the wafer is moved perpendicular to an optical axis of the lens assembly 208 by the wafer stage 210. Scanning of the reticle and the wafer occurs while the reticle and the wafer are moving synchronously.

Alternately, the exposure apparatus 120 can be a step-and-repeat type photolithography system that exposes the reticle while the reticle and the wafer are stationary. In the step and repeat process, the wafer is in a constant position relative to the reticle and the lens assembly 208 during the exposure of an individual field. Subsequently, between consecutive exposure steps, the wafer is consecutively moved by the wafer stage perpendicular to the optical axis of the lens assembly 208 so that the next field of the wafer is brought into position relative to the lens assembly 208 and the reticle for exposure. Following this process, the images on the reticle are sequentially exposed onto the fields of the wafer so that the next field of the wafer is brought into position relative to the lens assembly 208 and the reticle.

However, the use of the exposure apparatus 120 provided herein is not limited to a photolithography system for semiconductor manufacturing. The exposure apparatus 120, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The light source 202 can be g-line (436 nm), i-line (365 nm), KrF excimer laser (248 nm), ArF excimer laser (193 nm) and $F_2$ laser (157 nm). Alternately, the light source 202 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 208 included in the photolithography system, the lens assembly 208 need not be limited to a reduction system. It could also be a 1× or magnification system.

With respect to a lens assembly 208, when far ultra-violet rays such as the excimer laser is used, glass materials such as quartz and fluorite that transmit far ultra-violet rays is preferable to be used. When the $F_2$ type laser or x-ray is used, the lens assembly 208 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No, 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and cleanliness are controlled.

Figure 12:
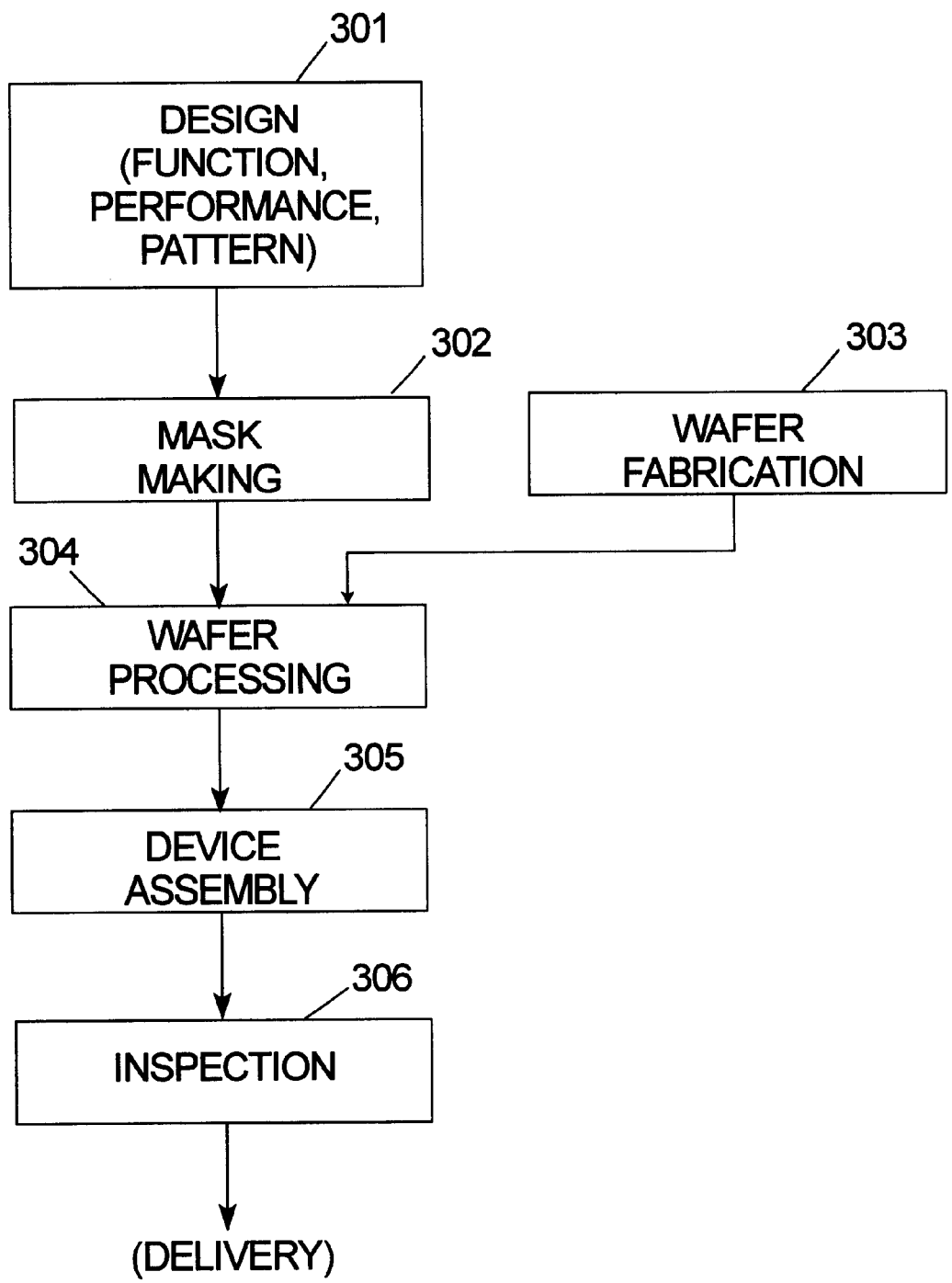
FIG. 12 is a flow chart that outlines a process for manufacturing a device in accordance with the present invention.

Further, semiconductor devices can be fabricated using the above described systems, by the process shown generally in FIG. 12. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 13:
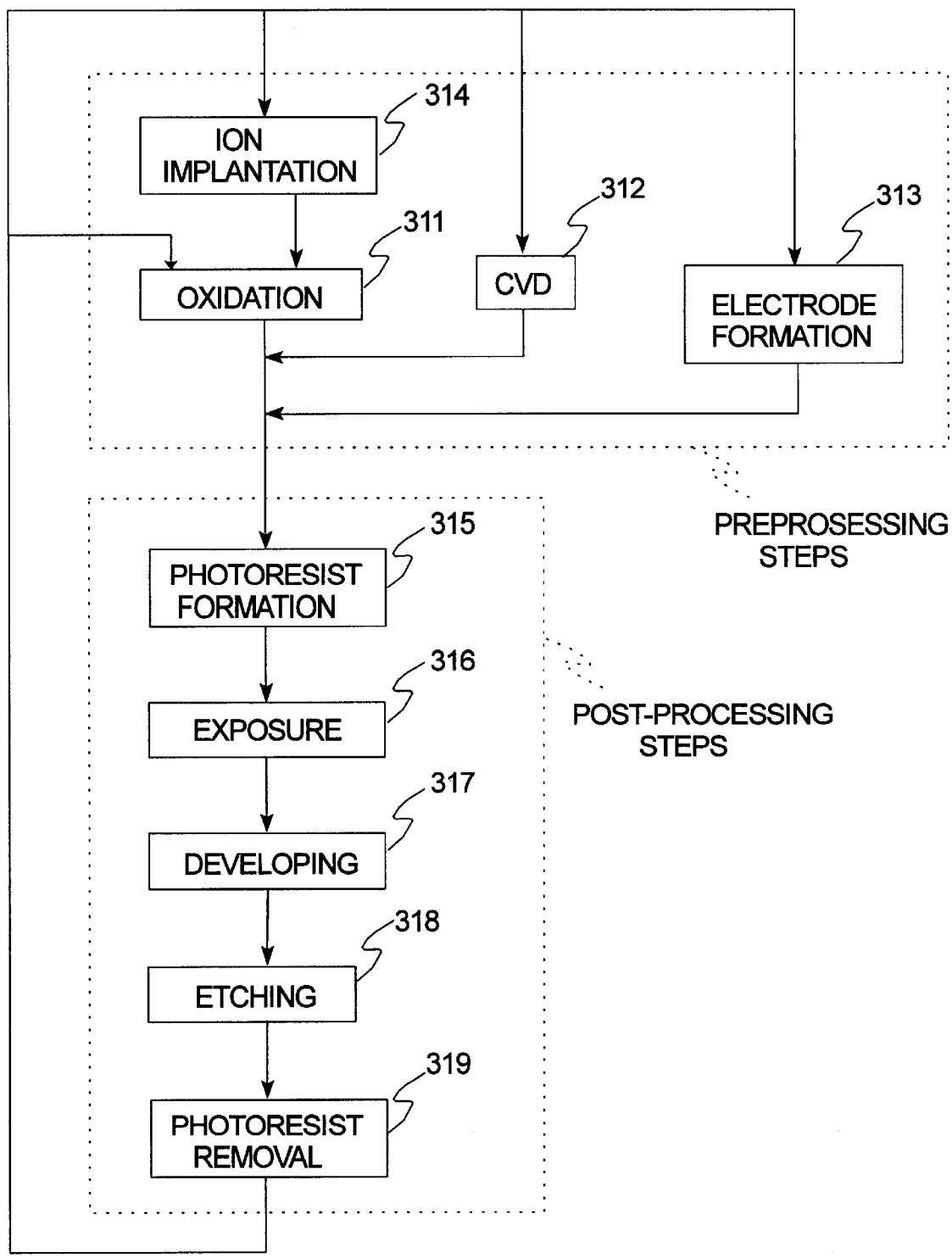
FIG. 13 is a flow chart that outlines device processing in more detail.

FIG. 13 illustrates a detailed flowchart example of the above-mentioned step 304 in the case of fabricating semiconductor devices. In FIG. 13, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, firstly, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A suspension system adapted for use with a bearing fluid for suspending a stage spaced apart from a stage base, the suspension system comprising:
a suspension assembly including (i) a fluid pad adapted to be in fluid communication so that the bearing fluid can be directed from the fluid pad to maintain the fluid pad spaced apart from the stage base, and (ii) an adaptable section adapted to secure the fluid pad to the stage, the adaptable section being adapted to allow for relative movement between the fluid pad and the stage, wherein the adaptable section includes a suspension member that has a characteristic controllable with no relation to the fluid.

2. The suspension system of claim 1 including a plurality of spaced apart suspension assemblies.

3. The suspension system of claim 1 wherein the adaptable section includes a spring.

4. The suspension system of claim 1 wherein the suspension member includes a flexible chamber at least partly filled with a chamber fluid that is supplied independently from the fluid directed to the fluid pad.

5. The suspension system of claim 4, further comprising a controller that controls a stiffness of the adaptable section by changing a characteristic of the chamber fluid.

6. The suspension system of claim 1 wherein the adaptable section includes a flexible member.

7. The suspension system of claim 1 including a restrictor which inhibits motion of the fluid pad transverse to a suspension axis of the suspension assembly.

8. The suspension system of claim 7 wherein the restrictor encircles a portion of the suspension assembly and inhibits motion of the fluid pad transverse to the suspension axis.

9. The suspension system of claim 7 wherein the restrictor extends between the fluid pad and stage and inhibits motion of the fluid pad transverse to the suspension axis.

10. A stage assembly including a stage base, a stage and the suspension system of claim 1 secured to the stage, the suspension assembly suspending the stage spaced apart from the stage base.

11. The stage assembly of claim 10 including a motor which is adapted to move the stage relative to the fluid pad.

12. An exposure apparatus including the stage assembly of claim 10.

13. A device manufactured with the exposure apparatus according to claim 12.

14. A wafer on which an image has been formed by the exposure apparatus of claim 12.

15. The suspension system of claim 1, wherein a stiffness of the adaptable section is variable.

16. A stage assembly for positioning an object, the stage assembly comprising:
a stage base;
a stage adapted to retain the object; and
a suspension system suspending the stage spaced apart from the stage base, the suspension system including a suspension assembly having (i) a fluid pad in fluid communication so that the bearing fluid can be directed from the fluid pad to maintain the fluid pad spaced apart from the stage base, and (ii) an adaptable section adapted to secure the fluid pad to the stage, the adaptable section being adapted to allow for relative movement between the fluid pad and the stage, wherein the adaptable section includes a suspension member that has a characteristic controllable with no relation to the fluid.

17. The stage assembly of claim 16 wherein the suspension system includes a plurality of spaced apart suspension assemblies secured to the stage.

18. The stage assembly system of claim 16 wherein the adaptable section includes a spring.

19. The stage assembly of claim 16 wherein the suspension member includes a flexible chamber at least partly filled with a chamber fluid that is supplied independently from the fluid directed to the fluid pad.

20. The stage assembly of claim 19, further comprising a controller that controls a stiffness of the adaptable section by changing a characteristic of the chamber fluid.

21. The stage assembly of claim 16 wherein the adaptable section includes a flexible member.

22. The stage assembly of claim 16 including a restrictor that inhibits motion of the fluid pad transverse to a suspension axis of the suspension assembly.

23. The stage assembly of claim 16 including a motor that is adapted to move the stage relative to the fluid pad.

24. An exposure apparatus including the stage assembly of claim 16.

25. A device manufactured with the exposure apparatus according to claim 24.

26. A wafer on which an image has been formed by the exposure apparatus of claim 24.

27. The stage assembly of claim 16, wherein a stiffness of the adaptable section is variable.

28. A method for suspending a stage spaced apart from a stage base, the method comprising the steps of:
securing a fluid pad to the stage with an adaptable section, the adaptable section allowing for relative movement between the fluid pad and the stage; and
creating a fluid bearing between the fluid pad and the stage base, wherein the adaptable section includes a suspension member that has a characteristic controllable with no relation to a fluid directed to the fluid bearing.

29. The method of claim 28 including the step of moving the stage relative to the fluid pad with a mover.

30. The method of claim 28 including the step of inhibiting motion of the fluid pad transverse to the stage.

31. The method of claim 28 including the step of controlling a stiffness of the adaptable section.

32. A method for making a stage assembly, the method comprising the steps of:
providing a stage;
providing a stage base;
securing a fluid pad to the stage with an adaptable section, the adaptable section allowing for relative movement between the fluid pad and the stage; and
creating a fluid bearing between the fluid pad and the stage base, wherein the adaptable section includes a suspension member that has a characteristic controllable with no relation to a fluid directed to the fluid bearing.

33. A method for making an exposure apparatus that forms an image on an object, the method comprising the steps of:
providing an irradiation apparatus that irradiates the object with radiation to form the image on the object; and
providing the stage assembly made by the method of claim 32.

34. A method of making a wafer utilizing the exposure apparatus made by the method of claim 33.

35. A method of making a device including at least the exposure process: wherein the exposure process utilizes the exposure apparatus made by the method of claim 33.

36. A stage assembly comprising:
a stage base;
a stage movable relative to the stage base;
a pad that is disposed between the stage base and the stage, and creates a fluid bearing with a first fluid, the fluid bearing maintaining the pad spaced apart from the stage base; and
a suspension member that connects the pad to the stage, the suspension member allowing for relative movement between the pad and the stage, the suspension member including a chamber at least partly filled with a second fluid which differs from the first fluid.

37. The stage assembly of claim 36, further comprising a controller connected to the suspension member, the controller controlling a characteristic of the second fluid.

38. An exposure apparatus including the stage assembly of claim 36.

39. A device manufactured with the exposure apparatus according to claim 38.

40. A wafer on which an image has been formed by the exposure apparatus of claim 38.

41. A suspension system adapted for use with a first fluid from a first fluid source for suspending a stage spaced apart from a stage base, the suspension system comprising:
a suspension assembly including (i) a fluid pad adapted to be in fluid communication with the first fluid source so that the first fluid can be directed from the fluid pad to maintain the fluid pad spaced apart from the stage base, and (ii) an adaptable section adapted to secure the fluid pad to the stage wherein the adaptable section has a characteristic controllable independent of the first fluid, the adaptable section being adapted to allow for relative movement between the fluid pad and the stage.

42. The suspension system of claim 41 wherein the adaptable section includes a flexible chamber at least partly filled with a second fluid from a second fluid source that is supplied independently from the first fluid directed to the fluid pad.

43. The suspension system of claim 42, further comprising a controller that controls a stiffness of the adaptable section by changing a characteristic of the second fluid, the stiffness of the adaptable section being controlled independent of a stiffness between the fluid pad and the stage base.

44. A stage assembly including a stage base, a stage and the suspension system of claim 41 secured to the stage, the suspension assembly suspending the stage spaced apart from the stage base.

45. An exposure apparatus including the stage assembly of claim 44.

46. A device manufactured With the exposure apparatus according to claim 45.

47. A wafer on which an image has been formed by the exposure apparatus of claim 45.

48. A method for making a stage assembly, the method comprising the steps of:

providing a stage;

providing a stage base;

providing a pad disposed between the stage and the stage base;

creating a fluid bearing with a first fluid, the fluid bearing maintaining the pad spaced apart from the stage base; and connecting the pad to the stage with a suspension member, the suspension member allowing for relative movement between the pad and the stage, the suspension member including a chamber at least partly filled with a second fluid which differs from the first fluid.

49. A method for making an exposure apparatus that forms an image on an object, the method comprising the steps of:

providing an irradiation apparatus that irradiates the object with radiation to form the image on the object; and providing the stage assembly made by the method of claim 48.

50. A method of making a wafer utilizing the exposure apparatus made by the method of claim 49.

51. A method of making a device including at least the exposure process: wherein the exposure process utilizes the exposure apparatus made by the method of claim 49.

52. A method for suspending a stage spaced apart from a stage base, the method comprising the steps of:

creating a fluid bearing between a fluid pad and the stage base using a first fluid to suspend the fluid pad spaced apart from the stage base; and securing the fluid pad to the stage with an adaptable section, the adaptable section allowing for relative movement between the fluid pad and the stage, the adaptable section having a characteristic controllable independent of the first fluid directed to the fluid bearing.

53. The method of claim 52 including the step of providing within the adaptable section a flexible chamber at least partly filled with a second fluid that is supplied independently from the first fluid directed to the fluid pad.

54. The method of claim 53 including the step of controlling a stiffness of the adaptable section by changing a characteristic of the second fluid, the stiffness of the adaptable section being controlled independent of a stiffness between the fluid pad and the stage base.

55. A method for making an exposure apparatus that forms an image on an object, the method comprising the steps of:

providing an irradiation apparatus that irradiates the object with radiation to form the image on the object; and providing a stage assembly including a stage suspended by the method of claim 52.

56. A method of making a wafer utilizing the exposure apparatus made by the method of claim 55.

57. A method of making a device including at least the exposure process: wherein the exposure process utilizes the exposure apparatus made by the method of claim 55.

* * * * *